US012757592B2

(12) United States Patent
Hong et al.

(10) Patent No.: US 12,757,592 B2
(45) Date of Patent: Oct. 6, 2026

(54) DISPLAY APPARATUS HAVING LINK WIRINGS

(71) Applicant: LG Display Co., Ltd., Seoul (KR)

(72) Inventors: Ye In Hong, Paju-si (KR); Jun Young Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 371 days.

(21) Appl. No.: 18/412,149

(22) Filed: Jan. 12, 2024

(65) Prior Publication Data

US 2024/0260351 A1 Aug. 1, 2024

(30) Foreign Application Priority Data

Jan. 30, 2023 (KR) ........................ 10-2023-0011922

(51) Int. Cl.
*H10K 59/131* (2023.01)
*H10K 59/80* (2023.01)

(52) U.S. Cl.
CPC ......... *H10K 59/131* (2023.02); *H10K 59/873* (2023.02); *H10K 59/874* (2023.02)

(58) Field of Classification Search
CPC ... H10K 59/131; H10K 59/874; H10K 59/873
USPC ............................................................ 257/40
See application file for complete search history.

(56) References Cited

U.S. PATENT DOCUMENTS 11,316,004 B2 4/2022 Kim et al.
11,723,250 B2 8/2023 Kim et al.
2020/0411629 A1 12/2020 Kim et al.
2021/0200363 A1* 7/2021 Lee ...................... H10K 59/121
2022/0206620 A1* 6/2022 Lee ...................... G06F 3/0412
2022/0206621 A1* 6/2022 Lee ...................... G06F 3/04164
2022/0206633 A1* 6/2022 Lee ...................... H10K 59/122
2022/0216294 A1 7/2022 Kim et al.
2022/0399739 A1* 12/2022 Park ...................... H01M 10/425
2023/0136156 A1* 5/2023 Kwon ...................... C05F 1/005 435/290.3
2023/0155543 A1* 5/2023 Jun ...................... H02S 20/32 136/246
2023/0238418 A1* 7/2023 Cho ...................... H10F 39/807 257/292

(Continued)

FOREIGN PATENT DOCUMENTS

KR 10-2021-0000383 A 1/2021

*Primary Examiner* — Jami Valentine Miller
(74) *Attorney, Agent, or Firm* — Fenwick & West LLP

(57) ABSTRACT

A display apparatus includes data link wirings that electrically connect a display area and a pad area of a bezel area. An upper interlayer insulating layer and a device passivation layer is on the data link wirings. A power voltage supply line electrically connecting the display area and the pad area is between the upper interlayer insulating layer and the device passivation layer. An encapsulating dam and an upper planarization layer are spaced apart on the device passivation layer. The encapsulating dam crosses between the display area and the pad area. The power voltage supply line includes a blocking hole between the encapsulating dam and the upper planarization layer, the blocking hole extending parallel to the encapsulating dam. The blocking hole may cross at least one of the regions between the link wirings. Thus, the penetration of external moisture via a void generated by the link wirings may be blocked.

19 Claims, 9 Drawing Sheets

(56) References Cited

U.S. PATENT DOCUMENTS

| | | | | |
|---|---|---|---|---|
| 2023/0337497 | A1 | 10/2023 | Kim et al. | |
| 2024/0224658 | A1* | 7/2024 | Jung .................... | H10K 59/131 |

* cited by examiner

DISPLAY APPARATUS HAVING LINK WIRINGS

CROSS-REFERENCE TO RELATED APPLICATION

This application claims the benefit of Republic of Korea Patent Application No. 10-2023-0011922, filed on Jan. 30, 2023, which is hereby incorporated by reference in its entirety.

BACKGROUND

Technical Field

The present disclosure relates to a display apparatus including link wirings electrically connected between a display area and a pad area of a bezel area.

Discussion of the Related Art

Generally, a display apparatus provides an image to a user. For example, the display apparatus may include light-emitting devices on a device substrate. Each of the light-emitting devices may emit light displaying a specific color. For example, each of the light-emitting devices may have a first electrode, a light-emitting layer and a second electrode, which are sequentially stacked on the device substrate.

The device substrate may include a display area in which the light-emitting devices are disposed, and a bezel area disposed outside the display area. A pad area in which an external signal is applied may be disposed in the bezel area. The pad area may be electrically connected to the display area by link wirings.

A power voltage supply line supplying a power voltage may be disposed on the link wirings. For example, each of the link wirings may partially overlap the power voltage supply line. The power voltage supply line may be insulated from the link wirings. For example, an upper interlayer insulating layer may be disposed between the link wirings and the power voltage supply line.

The upper interlayer insulating layer may have a thickness different by the link wirings. For example, an upper surface of the upper interlayer insulating layer opposite to the device substrate may have a concave-convex shape due to the link wires. Thus, in the display apparatus, a void may be generated by the concave-convex shape of the upper interlayer insulating layer around a portion of the encapsulating dam in which an organic insulating layer is not formed. The void may function as a penetration path of external moisture. Therefore, in the display apparatus, the light-emitting devices may be deteriorated due to the void generated by the link wires.

SUMMARY

Accordingly, the present disclosure is directed to a display apparatus that substantially obviates one or more problems due to limitations and disadvantages of the related art.

An object of the present disclosure is to provide a display apparatus capable of preventing the deterioration of the light-emitting device due to the penetration of external moisture.

Another object of the present disclosure is to provide a display apparatus capable of preventing the penetration of the external moisture via the void generated by the link wirings.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. Data link wirings are disposed on the device substrate. The data link wirings electrically connect a display area and a pad area of a bezel area. The display area and the pad area are disposed side by side in a first direction. An upper interlayer insulating layer is disposed on the data link wirings. The upper interlayer insulating layer overlaps the display area and the bezel area. A power voltage supply line and a device passivation layer are disposed on the upper interlayer insulating layer. The power voltage supply line electrically connects the display area and the pad area. The device passivation layer covers the power voltage supply line. A first encapsulating dam and a planarization layer are disposed on the device passivation layer. The first encapsulating dam extends between the display area and the pad area in a second direction. The second direction is a direction intersecting the first direction. The planarization layer is spaced apart from the first encapsulating dam. The power voltage supply line includes a plurality of blocking holes extending between the first encapsulating dam and the planarization layer in the second direction. Each of the blocking holes crosses at least one of regions, which are disposed between the link wirings.

The device substrate may include a dam area, a first bezel area and a second bezel area. The first encapsulating dam may be disposed on the dam area. The first bezel area may be disposed between the display area and the dam area. The planarization layer may be disposed on the first bezel area. The second bezel area may be disposed between the first bezel area and the dam area. The plurality of blocking holes comprises a plurality of second blocking holes, the plurality of the second blocking holes may be disposed side by side in the second direction on the second bezel area.

The device substrate may include a dam area in which the first encapsulating dam is disposed, a third bezel area disposed between the dam area and the pad area, and a fourth bezel area disposed between the third bezel area and the pad area, wherein the planarization layer is disposed on the fourth bezel area, and wherein the plurality of blocking holes comprises a plurality of first blocking holes, the plurality of the first blocking holes is disposed side by side in the second direction on the third bezel area.

A width of each of the blocking holes may be greater than a distance between the data link wirings.

The device passivation layer may include a portion disposed inside each of the blocking holes.

A second encapsulating dam may be disposed on the device passivation layer. The second encapsulating dam may extend between the first encapsulating dam and the pad area in the second direction. The plurality of blocking holes may include a plurality of third blocking holes extending between the first encapsulating dam and the second encapsulating dam in the second direction. Each of the third blocking holes may cross at least one of regions, which are disposed between the data link wirings.

A region in which each of the third blocking holes crosses may be different from regions in which the first blocking holes or the second blocking holes cross.

A width of each of the third blocking holes may be greater than a distance between the data link wirings.

Each of the first, second and third blocking holes may have a same size.

The device passivation layer may include a portion disposed inside each of the third blocking holes.

The data link wirings may extend a direction inclined to the first direction and the second direction.

The display apparatus may further comprise: an inner dummy wiring, disposed in the first bezel area and between the planarization layer and the device passivation layer, wherein the inner dummy wiring is electrically connected to the power voltage supply line.

A sidewall of one or more of the plurality of blocking holes may extend in a direction inclined to the first direction and the second direction.

In another embodiment, there is provided a display apparatus comprising a device substrate. The device substrate includes a display area, a first bezel area, a second bezel area, a dam area, a third bezel area, a fourth bezel area, a bending area and a pad area, which are disposed side by side in a first direction. An upper interlayer insulating layer is disposed on the display area. The upper interlayer insulating layer extends onto the pad area. Data link wirings are disposed between the device substrate and the upper interlayer insulating layer. A power voltage supply line is disposed on the upper interlayer insulating layer. The data link wirings and the power voltage supply line cross the bending area. The data link wirings and the power voltage supply line electrically connect the display area and the pad area. A device passivation layer is disposed on the upper interlayer insulating layer. The device passivation layer covers the power voltage supply line. An encapsulating dam and an upper planarization layer are disposed device passivation layer. The encapsulation dam is disposed on the dam area. The encapsulating dam crosses between the bending area and the display area in a second direction intersecting the first direction. The planarization layer is disposed on the display area, the first bezel area and the fourth bezel area. The planarization layer is spaced apart from the second bezel area, the dam area and the third bezel area. The power voltage supply line includes a first blocking hole and a second blocking hole. The first blocking hole is disposed on the third bezel area. The second blocking hole is disposed on the second bezel area. Each of the first blocking hole and the second blocking hole extends parallel to the encapsulating dam. Each of the first blocking hole and the second blocking hole crosses at least one of regions disposed between the data link wirings.

A region in which the second blocking hole crosses may be a region in which the first blocking hole does not cross.

Each of the first blocking hole and the second blocking hole may have a width larger than a distance between the data link wirings.

The second blocking hole may have a same size as the first blocking hole.

The device passivation layer may include a portion disposed inside of the first blocking hole and a portion disposed inside of the second blocking hole.

The display apparatus may further comprise: a third blocking hole disposed between a plurality of encapsulating dams, and wherein the third blocking hole crosses at least one of regions disposed between the data link wirings.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
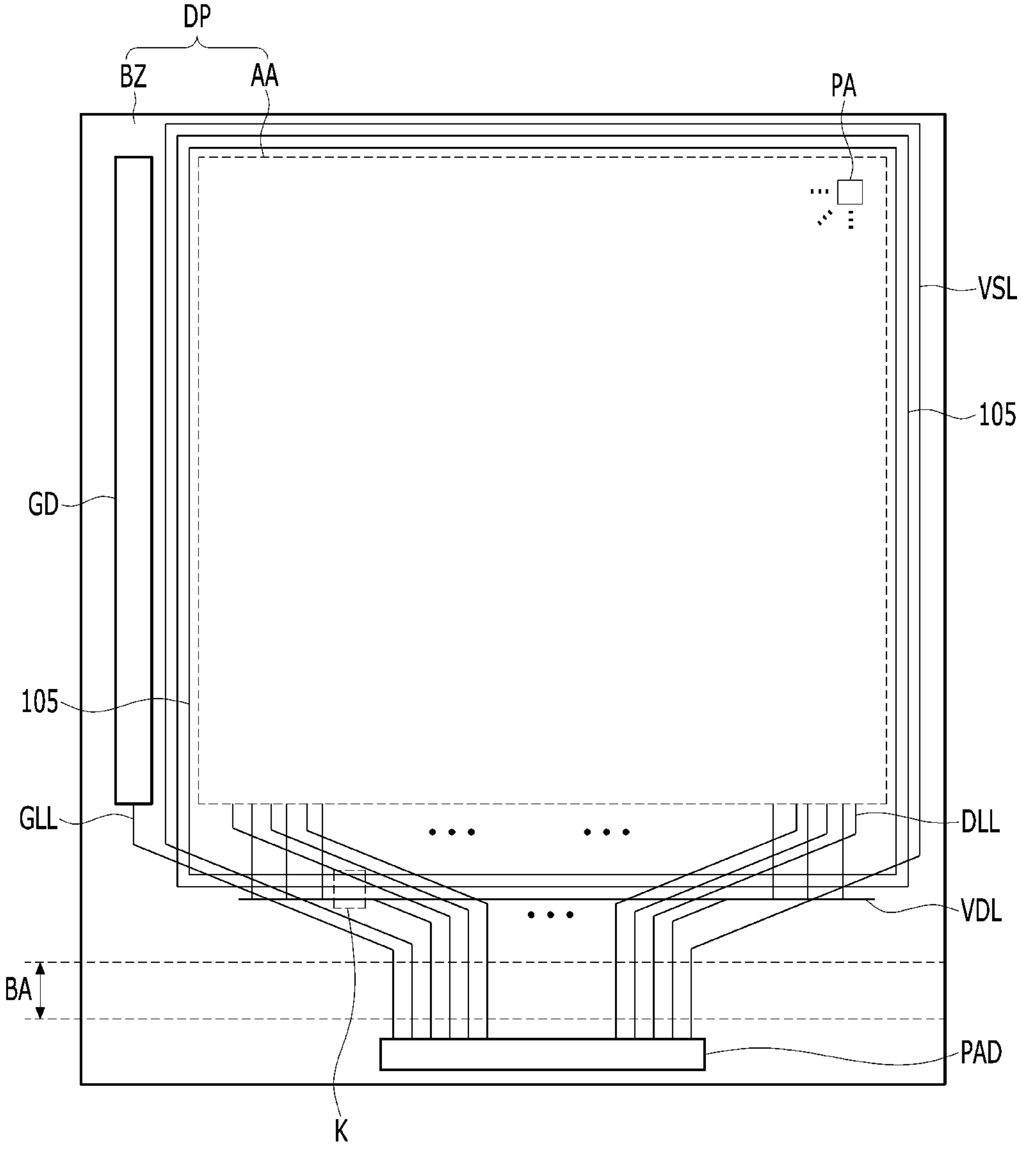
FIG. 1 is a schematic view of a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes"

specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
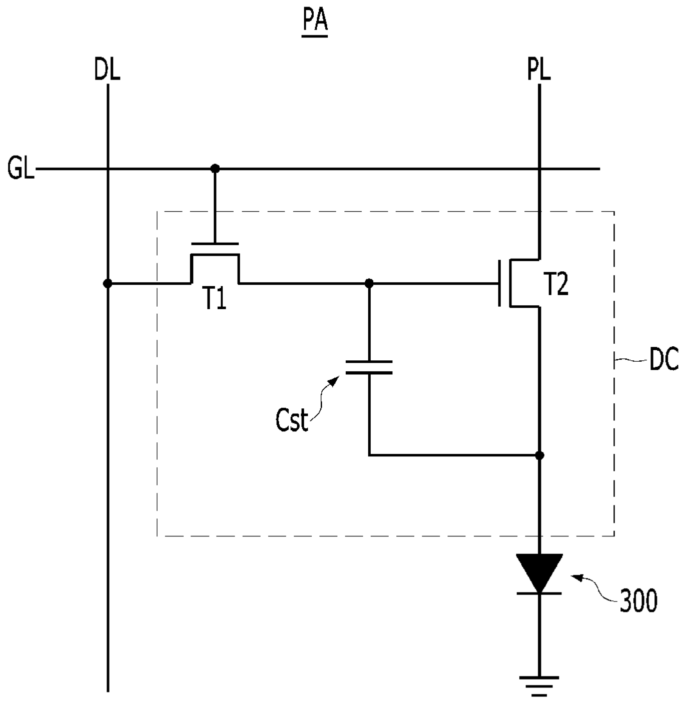
FIG. 2 is a view showing a circuit of a unit pixel area in the display apparatus according to an embodiment of the present disclosure.
Figure 3:
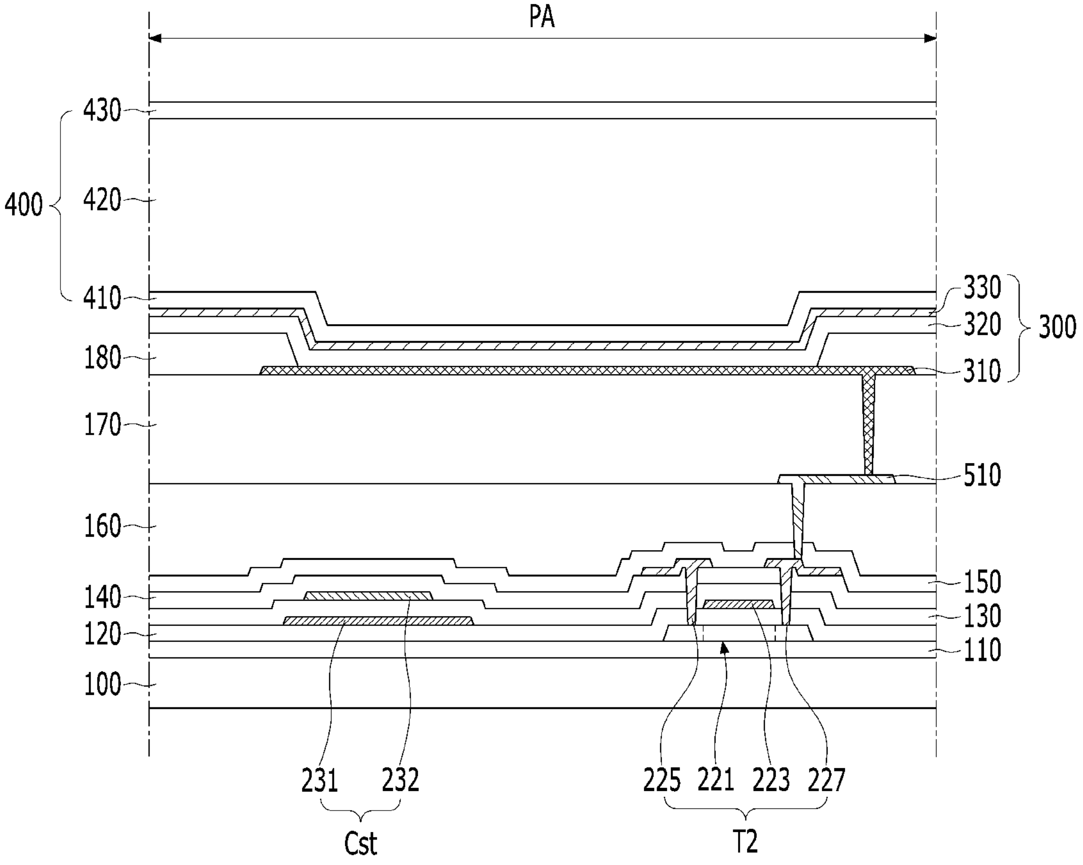
FIG. 3 is a cross-section view of the pixel area in the display apparatus according to an embodiment of the present disclosure.

FIG. 1 is a schematic view of a display apparatus according to an embodiment of the present disclosure. FIG. 2 is a view showing a circuit of a unit pixel area in the display apparatus according to an embodiment of the present disclosure. FIG. 3 is a cross-section view of the pixel area in the display apparatus according to the embodiment of the present disclosure.

Referring to FIGS. 1 to 3, the display apparatus according to the embodiment of the present disclosure may include a display panel DP. The display panel DP may generate an image provided to a user. For example, the display panel DP may include a plurality of pixel area PA.

Various signals may be provided in each pixel area PA through signal wirings GL, DL and PL. For example, the signal wirings GL, DL and PL may include gate lines GL applying a gate signal to each pixel area PA, data lines DL applying a data signal to each pixel area PA, and power lines PL supplying a positive power voltage to each pixel area PA. The gate lines GL may be electrically connected to a gate driver GD, and the data lines DL may be electrically connected to a data driver. The power lines PL may be electrically connected to a power unit.

The gate driver GD and the data driver may be controlled by a timing controller. For example, the gate driver GD may receive clock signals, reset signals and a start signal from the timing controller, and the data driver may receive digital video data and a source timing signal from the timing controller.

Each of the pixel areas PA may realize a specific color. For example, a light-emitting device 300 and a pixel driving circuit DC electrically connected to the light-emitting device 300 may be disposed in each pixel area PA. The light-emitting device 300 and the pixel driving circuit DC of each pixel area PA may be disposed on a device substrate 100. The device substrate 100 may include an insulating material. For example, the device substrate 100 may include glass or plastic.

The light-emitting device 300 of each pixel area PA may emit light displaying a specific color. For example, the light-emitting device 300 of each pixel area PA may include a first electrode 310, a light-emitting layer 320 and a second electrode 330, which are sequentially stacked on the device substrate 100.

The first electrode 310 may include a conductive material. The first electrode 310 may include a material having a high reflectance. For example, the first electrode 310 may be a metal, such as aluminum (Al) and silver (Ag). The first electrode 310 may have a multi-layer structure. For example, the first electrode 310 may have a structure in which a reflective electrode made of a metal is disposed between transparent electrodes made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. A transmittance of the second electrode 330 may be higher than a transmittance of the first electrode 310. For example, the second electrode 330 may be a transparent electrode made of a transparent conductive material, such as ITO and IZO. Thus, in the display apparatus according to the embodiment of the present disclosure, the light generated by the light-emitting layer 320 may be emitted outside through the second electrode 330.

The pixel driving circuit DC of each pixel area PA may supply a driving current corresponding to the data signal to the light-emitting device 300 of the corresponding pixel area PA according to the gate signal for one frame. For example, the pixel driving circuit DC of each pixel area PA may include a first thin film transistor T1, a second thin film transistor T2 and a storage capacitor Cst.

The first thin film transistor T1 may include a first semiconductor pattern, a first gate electrode, a first drain electrode and a first source electrode. The first thin film transistor T1 may transmit the data signal to the second thin film transistor T2 according to the gate signal. For example, the first thin film transistor T1 may be a switching thin film transistor. The first gate electrode may be electrically connected to one of the gate lines GL, and the first drain electrode may be electrically connected to one of the date lines DL.

The first semiconductor pattern may include a semiconductor material. For example, the first semiconductor pattern may include amorphous silicon (a-Si), polycrystalline silicon (poly-Si) or an oxide semiconductor, such as IGZO. The first semiconductor pattern may include a first drain region, a first channel region and a first source region. The first channel region may be disposed between the first drain region and the first source region. A resistance of the first drain region and a resistance of the first source region may be smaller than a resistance of the first channel region. For example, the first drain region and the first source region may include a conductive region of an oxide semiconductor. The first channel region may be a region of an oxide semiconductor, which is not conductorized.

The first gate electrode may include a conductive material. For example, the first gate electrode may include a metal, such as aluminum (Al), chrome (Cr), copper (Cu), molybdenum (Mo), titanium (Ti) and tungsten (W). The first gate electrode may be disposed on the first semiconductor pattern. For example, the first gate electrode may overlap the first channel region of the first semiconductor pattern. The first drain region and the first source region of the first semiconductor pattern may be disposed outside the first gate electrode. The first gate electrode may be insulated from the first semiconductor pattern. For example, the first source region of the first semiconductor pattern may be electrically connected to the first drain region of the first semiconductor pattern according to a signal applied to the first gate electrode.

The first drain electrode may include a conductive material. For example, the first drain electrode may include a metal, such as aluminum (Al), chrome (Cr), copper (Cu), molybdenum (Mo), titanium (Ti) and tungsten (W). The first drain electrode may include a material different from the first gate electrode. The first drain electrode may be disposed on a layer different from the first gate electrode. For example, the first drain electrode may be insulated from the first gate electrode. The first drain electrode may be electrically connected to the first drain region of the first semiconductor pattern.

The first source electrode may include a conductive material. For example, the first source electrode may include a metal, such as aluminum (Al), chrome (Cr), copper (Cu), molybdenum (Mo), titanium (Ti) and tungsten (W). The first source electrode may include a material different from the first gate electrode. The first source electrode may be disposed on a layer different from the first gate electrode. For example, the first source electrode may be disposed on a same layer as the first drain electrode. The first source electrode may include a same material as the first drain electrode. The first source electrode may be insulated from the first gate electrode. For example, the first source electrode may be electrically connected to the first source region of the first semiconductor pattern.

The second thin film transistor T2 may include a second semiconductor pattern 221, a second gate electrode 223, a second drain electrode 225 and a second source electrode 227. The second thin film transistor T2 may generate the driving current corresponding to the data signal. For example, the second thin film transistor T2 may be a driving thin film transistor. The second gate electrode 223 may be electrically connected to the first source electrode, and the second drain electrode 225 may be electrically connected to one of the power lines PL.

The second semiconductor pattern 221 may include a semiconductor material. For example, the second semiconductor pattern 221 may include amorphous silicon (a-Si), polycrystalline silicon (poly-Si) or an oxide semiconductor, such as IGZO. The second semiconductor pattern 221 may include a second channel region between a second drain region and a second source region. The second drain region and the second source region may have a resistance smaller than the second channel region. For example, the second drain region and the second source region may include a conductive region of an oxide semiconductor, and the second channel region may be a region of an oxide semiconductor, which is not conductorized.

The second semiconductor pattern 221 may be disposed on a same layer as the first semiconductor pattern. The second semiconductor pattern 221 may include a same material as the first semiconductor pattern. For example, the second semiconductor pattern 221 may be formed simultaneously with the first semiconductor pattern.

The second gate electrode 223 may include a conductive material. For example, the second gate electrode 223 may include a metal, such as aluminum (Al), chrome (Cr), copper (Cu), molybdenum (Mo), titanium (Ti) and tungsten (W). The second gate electrode 223 may be disposed on a same layer as the first gate electrode. The second gate electrode 223 may include a same material as the first gate electrode. For example, the second gate electrode 223 may be formed simultaneously with the first gate electrode.

The second gate electrode 223 may be disposed on the second semiconductor pattern 221. For example, the second gate electrode 223 may overlap the second channel region of the second semiconductor pattern 221. The second drain region and the second source region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second drain electrode 225 may include a conductive material. For example, the second drain electrode 225 may include a metal, such as aluminum (Al), chrome (Cr), copper (Cu), molybdenum (Mo), titanium (Ti) and tungsten (W). The second drain electrode 225 may include a material different from the second gate electrode 223. The second drain electrode 225 may be disposed on a layer different from the second gate electrode 223. For example, the second drain electrode 225 may be insulated from the second gate electrode 223. The second drain electrode 225 may be electrically connected to the second drain region of the second semiconductor pattern 221.

The second drain electrode 225 may be disposed on a same layer as the first drain electrode. The second drain electrode 225 may include a same material as the first drain electrode. For example, the second drain electrode 225 may be formed simultaneously with the first drain electrode.

The second source electrode 227 may include a conductive material. For example, the second source electrode 227 may include a metal, such as aluminum (Al), chrome (Cr), copper (Cu), molybdenum (Mo), titanium (Ti) and tungsten (W). The second source electrode 227 may include a material different from the second gate electrode 223. The second source electrode 227 may be disposed on a layer different from the second gate electrode 223. For example, the second source electrode 227 may be disposed on a same layer as the second drain electrode 225. The second source electrode 227 may include a same material as the second drain electrode 225. For example, the second source electrode 227 may be formed simultaneously with the second drain electrode 225. The second source electrode 227 may be insulated from the second gate electrode 223. The second source electrode 227 may be electrically connected to the second source region of the second semiconductor pattern 221.

The second source electrode 227 may be disposed on a same layer as the first source electrode. The second source electrode 227 may include a same material as the first source electrode. For example, the second source electrode 227 may be formed simultaneously with the first source electrode.

The storage capacitor Cst may maintain a signal applied to the second gate electrode 223 of the second thin film transistor T2 for one frame. For example, the storage capacitor Cst may be electrically connected between the second gate electrode 223 and the second source electrode 227 of the second thin film transistor T2. The storage capacitor Cst may have a stacked structure of capacitor electrodes 231 and 232. For example, the storage capacitor Cst may include a first capacitor electrode 231 and a second capacitor electrode 232. At least one of the capacitor electrodes 231 and 232 may be formed by using a process of forming the first thin film transistor T1 and the second thin film transistor T2. For example, the first capacitor electrode 231 may include a same material as the second gate electrode 223. The second capacitor electrode 232 may include a material different from the second drain electrode 225 and the second source electrode 227. For example, the second capacitor electrode 232 may be disposed on a layer different from the second drain electrode 225 and the second source electrode 227.

A plurality of insulating layers 110, 120, 130, 140, 150, 160, 170 and 180 for preventing unnecessary electrical connection in each pixel area PA may be disposed on the device substrate 100. For example, a buffer insulating layer 110, a gate insulating layer 120, a lower interlayer insulating layer 130, an upper interlayer insulating layer 140, a device passivation layer 150, a lower planarization layer 160, an upper planarization layer 170 and a bank insulating layer 180 may be disposed on the device substrate 100.

The buffer insulating layer 110 may be disposed close to the device substrate 100. The buffer insulating layer 110 may prevent pollution due to the device substrate 100 in a process of forming the pixel driving circuit DC in each pixel area PA. For example, an upper surface of the device substrate 100 toward the pixel driving circuit DC of each pixel area PA may be completely covered by the buffer insulating layer 110. The first thin film transistor T1, the second thin film transistor T2 and the storage capacitor Cst of each pixel area PA may be disposed on the buffer insulating layer 110. The buffer insulating layer 110 may include an insulating material. For example, the buffer insulating layer 110 may include an inorganic insulating material, such as silicon oxide ($SiO_x$) and silicon nitride ($SiN_x$). The buffer insulating layer 110 may have a multi-layer structure. For example, the buffer insulating layer 110 may have a stacked structure of an inorganic insulating layer made of silicon oxide ($SiO_x$) and an inorganic insulating layer made of silicon nitride ($SiN_x$).

The gate insulating layer 120 may be disposed on the buffer insulating layer 110. The first gate electrode and the second gate electrode 223 of each pixel area PA may be insulated from the first semiconductor pattern and the second semiconductor pattern 221 of the corresponding pixel area PA by the gate insulating layer 120. For example, the gate insulating layer 120 may cover the first semiconductor pattern and the second semiconductor pattern 221 of each pixel area PA. The first gate electrode and the second gate electrode 223 of each pixel area PA may be disposed on the gate insulating layer 120. The first capacitor electrode 231 of each pixel area PA may be disposed on the gate insulating layer 120. The gate insulating layer 120 may include an insulating material. For example, the gate insulating layer 120 may include an inorganic insulating material, such as silicon oxide ($SiO_x$) and silicon nitride ($SiN_x$).

The lower interlayer insulating layer 130 may be disposed on the gate insulating layer 120. The upper interlayer insulating layer 140 may be disposed on the lower interlayer insulating layer 130. The first drain electrode, the first source electrode, the second drain electrode 225 and the second source electrodes 227 of each pixel area PA may be insulated from the first gate electrode and the second gate electrode 223 of the corresponding pixel area PA by the lower interlayer insulating layer 130 and the upper interlayer insulating layer 140. For example, the lower interlayer insulating layer 130 may cover the first gate electrode and the second gate electrode 223 of each pixel area PA. The first drain electrode, the first source electrode, the second drain electrode 225 and the second source electrode 227 of each pixel area PA may be disposed on the upper interlayer insulating layer 140. The lower interlayer insulating layer 130 and the upper interlayer insulating layer 140 may include an insulating material. For example, the lower interlayer insulating layer 130 and the upper interlayer insulating layer 140 may include an inorganic insulating material, such as silicon oxide ($SiO_x$) and silicon nitride ($SiN_x$). The upper interlayer insulating layer 140 may include a material different from the lower interlayer insulating layer 130. Thus, in the display apparatus according to the embodiment of the present disclosure, the stability of the pixel driving circuit DC in each pixel area PA may be improved. The second capacitor electrode 232 of each pixel area PA may be disposed between the lower interlayer insulating layer 130 and the upper interlayer insulating layer 140.

The device passivation layer 150 may be disposed on the upper interlayer insulating layer 140. The device passivation layer 150 may prevent damage of the pixel driving circuit DC in each pixel area PA due to external impact and moisture. For example, the first drain electrode, the first source electrode, the second drain electrode 225 and the second source electrode 227 of each pixel area PA may be covered by the device passivation layer 150. The device passivation layer 150 may include an insulating material. For example, the device passivation layer 150 may be an inorganic insulating material, such as silicon oxide ($SiO_x$) and silicon nitride ($SiN_x$).

The lower planarization layer 160 and the upper planarization layer 170 may be sequentially stacked on the device passivation layer 150. For example, the lower planarization layer 160 may be disposed between the device passivation layer 150 and the upper planarization layer 170. The lower planarization layer 160 and the upper planarization layer 170 may eliminate a thickness difference due to the pixel driving circuit DC of each pixel area PA. For example, an upper surface of the upper planarization layer 170 opposite to the device substrate 100 may be a flat surface. The lower planarization layer 160 and the upper planarization layer 170 may include an insulating material. The lower planarization layer 160 and the upper planarization layer 170 may include a material different from the device passivation layer 150. For example, the lower planarization layer 160 and the upper planarization layer 170 may include an organic insulating material. The upper planarization layer 170 may include a material different from the lower planarization layer 160.

The light-emitting device 300 of each pixel area PA may be disposed on the upper planarization layer 170. For example, the first electrode 310, the light-emitting layer 320 and the second electrode 330 of each pixel area PA may be sequentially stacked on the upper surface of the upper planarization layer 170 in the corresponding pixel area PA. The first electrode 310 of each pixel area PA may be in direct contact with the upper surface of the upper planarization layer 170. Thus, in the display apparatus according to the embodiment of the present disclosure, luminance deviation according to a generation position of the light emitted from the light-emitting device 300 of each pixel area PA may be prevented.

Intermediate electrodes 510 may be disposed between the lower planarization layer 160 and the upper planarization layer 170. The intermediate electrodes 510 may include a conductive material. For example, the intermediate electrodes 510 may include a metal, such as aluminum (Al), chrome (Cr), copper (Cu), molybdenum (Mo), titanium (Ti) and tungsten (W). The first electrode 310 of each pixel area PA may be electrically connected to the second source electrode 227 of the corresponding pixel area PA through one of the intermediate electrodes 510. For example, each of the intermediate electrodes 510 may be in direct contact with the second source electrode 227 of each pixel area PA by penetrating the lower planarization layer 160 in the corresponding pixel area PA, and the first electrode 310 of each pixel area PA may be in direct contact with one of the intermediate electrodes 510 by penetrating the upper planarization layer 170 in the corresponding pixel area PA.

The bank insulating layer 180 may be disposed on the upper planarization layer 170. The bank insulating layer 180 may define an emission area in each pixel area PA. For example, the bank insulating layer 180 may cover an edge of the first electrode 310 in each pixel area PA. The light-emitting layer 320 and the second electrode 330 of each pixel area PA may be sequentially stacked on a portion of the corresponding first electrode 310 exposed by the bank insulating layer 180. The bank insulating layer 180 may include an insulating material. For example, the bank insulating layer 180 may be an organic insulating material. The bank insulating layer 180 may include a material different from the upper planarization layer 170.

At least a portion of the light-emitting layer 320 of each pixel area PA may extend outside of the corresponding pixel area PA. For example, at least one of the hole injection layer (HIL), the hole transport layer (HTL), the electron transport layer (ETL) and the electron injection layer (EIL) in each pixel area PA may extend on the bank insulating layer 180. At least one of the hole injection layer (HIL), the hole transport layer (HTL), the electron transport layer (ETL) and the electron injection layer (EIL) in each pixel area PA may be formed simultaneously with the corresponding layer in adjacent pixel area PA. For example, at least one of the hole injection layer (HIL), the hole transport layer (HTL), the electron transport layer (ETL) and the electron injection layer (EIL) may be formed on an entire surface of the device substrate 100. Thus, in the display apparatus according to the embodiment of the present disclosure, the process efficiency may be improved.

A voltage applied to the second electrode 330 of each pixel area PA may be a same as a voltage applied to the second electrode 330 of adjacent pixel area PA. For example, a negative power voltage may be applied to the second electrode 330 of each pixel area PA. The second electrode 330 of each pixel area PA may be electrically connected to the second electrode 330 of adjacent pixel area PA. The second electrode 330 of each pixel area PA may include a same material as the second electrode 330 of adjacent pixel area PA. For example, the second electrode 330 of each pixel area PA may be formed simultaneously with the second electrode 330 of adjacent pixel area PA. The second electrode 330 of each pixel area PA may be in direct contact with the second electrode 330 of adjacent pixel area PA. For example, the second electrode 330 of each pixel area PA may extend outside of the corresponding pixel area PA. Thus, in the display apparatus according to the embodiment of the present disclosure, a process of forming the second electrode 330 in each pixel area PA may be simplified. Therefore, in the display apparatus according to the embodiment of the present disclosure, the process efficiency may be improved. And, in the display apparatus according to the embodiment of the present disclosure, the luminance of the light emitted from the light-emitting device 300 of each pixel area PA may be adjusted by the data signal applied to the pixel driving circuit DC of the corresponding pixel area PA.

An encapsulation unit 400 may be disposed on the light-emitting device 300 of each pixel area PA. The encapsulation unit 400 may prevent or at least reduce damage of the light-emitting devices 300 due to external moisture and impact. For example, the light-emitting device 300 of each pixel area PA may be completely covered by the encapsulation unit 400. The encapsulation unit 400 may have a multi-layer structure. For example, the encapsulation unit 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may be an inorganic insulating material, and the second encapsulating layer 420 may be an organic insulating material. Thus, in the display apparatus according to the embodiment of the present disclosure, the damage of the light-emitting devices 300 due to the external moisture and impact may be effectively prevented. A thickness difference due to the light-emitting devices 300 may be eliminated by the second encapsulating layer 420. For example, an upper surface of the encapsulation unit 400 opposite to the device substrate 100 may be a flat surface on the pixel areas PA.

The display panel DP may include the display area AA in which the pixel areas PA are disposed, and a bezel area BZ disposed outside the display area AA. At least one of the gate driver GD, the data driver, the power unit and the timing controller may be disposed on the bezel area BZ of the display panel DP. For example, the display apparatus according to the embodiment of the present disclosure may be a GIP (Gate In Panel) type display apparatus in which the gate driver GD is formed on the bezel area BZ of the display panel DP.

A pad area PAD may be disposed in the bezel area BZ. A signal applied from outside of the device substrate 100 may be transmitted to the display area AA through the pad area PAD. For example, at least one gate link wiring GLL electrically connecting the pad area PAD to the gate driver GD, and data link wirings DLL electrically connecting the pad area PAD to the display area AA may be disposed on the device substrate 100. Each of the data lines DL may be electrically connected to one of the data link wirings DLL. For example, the data driver may apply the data signal to each pixel area PA through the pad area PAD, the data link wirings DLL and the data lines DL.

Figure 4:
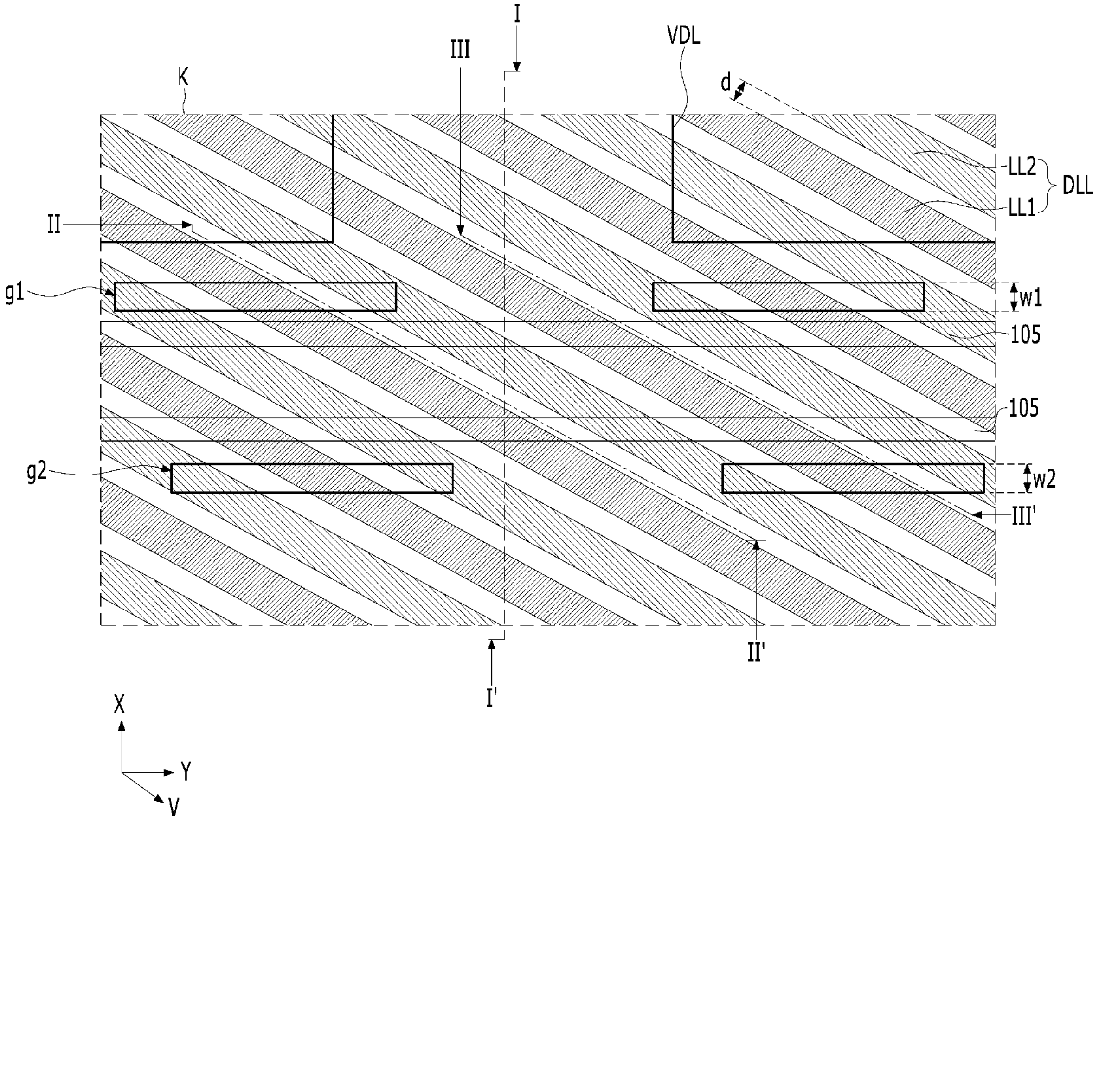
FIG. 4 is an enlarged view of K region in FIG. 1, according to an embodiment of the present disclosure.
Figure 5:
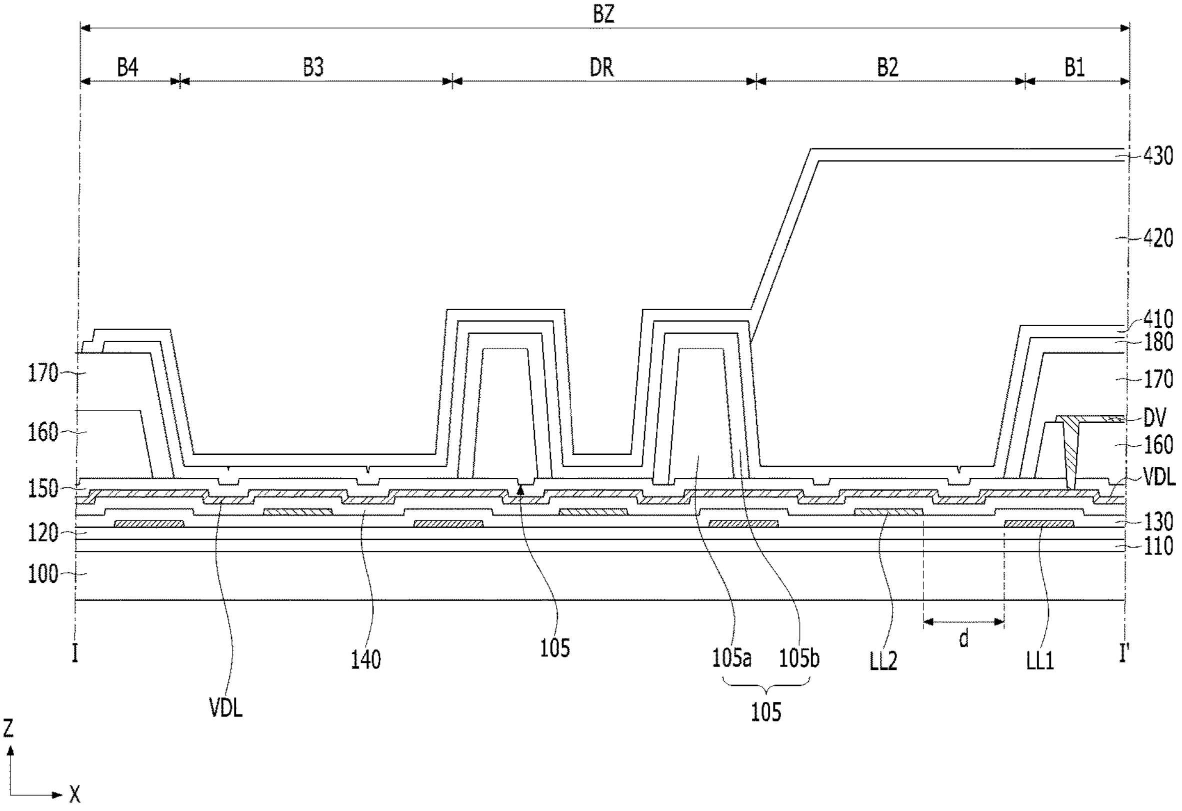
FIG. 5 is a view taken along I-I' of FIG. 4, according to an embodiment of the present disclosure.
Figure 6:
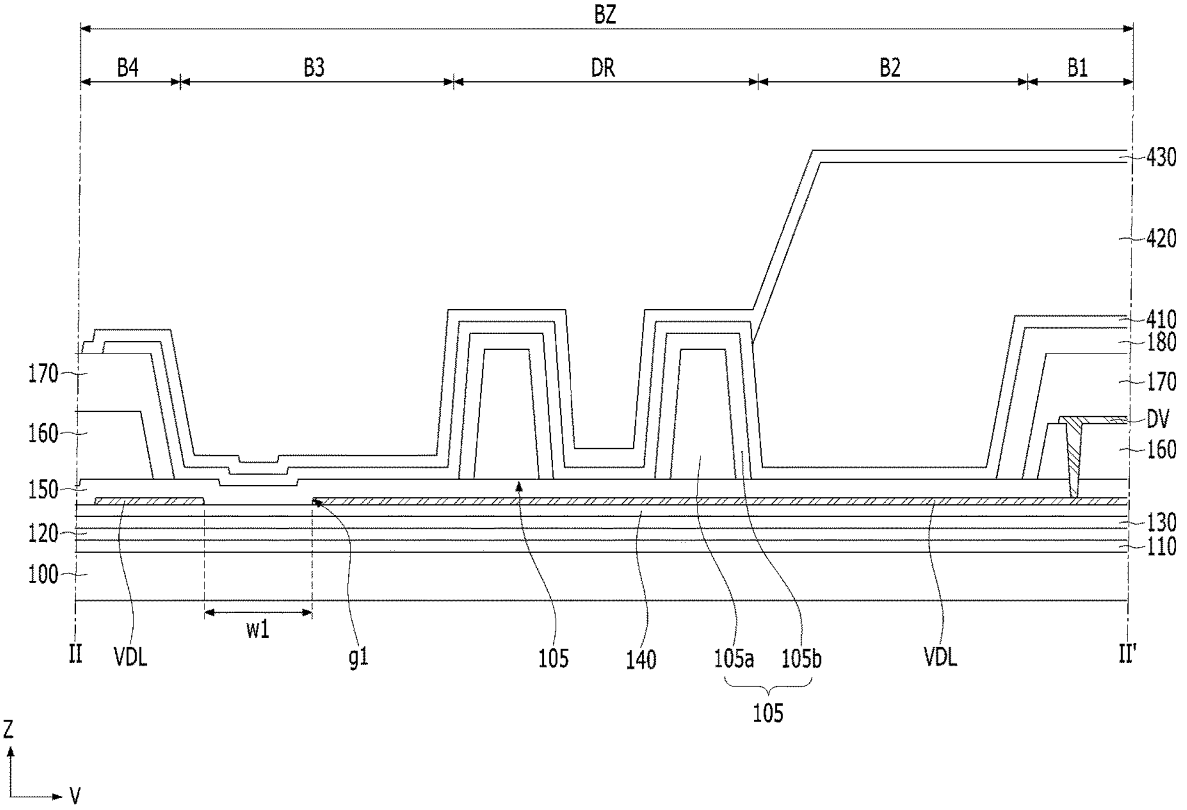
FIG. 6 is a view taken along II-II' of FIG. 4, according to an embodiment of the present disclosure.
Figure 7:
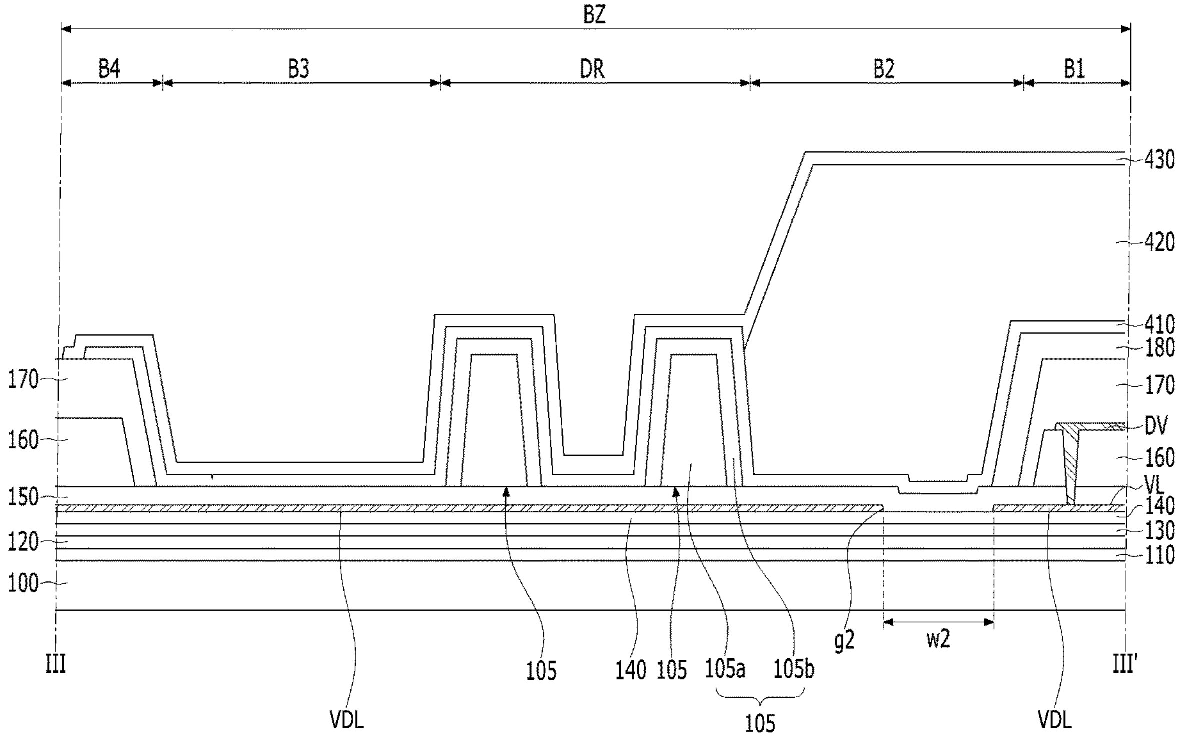
FIG. 7 is a view taken along III-III' of FIG. 4 according to an embodiment of the present disclosure.

FIG. 4 is an enlarged view of K region in FIG. 1, according to an embodiment of the present disclosure. FIG. 5 is a view taken along I-I' of FIG. 4, according to an embodiment of the present disclosure. FIG. 6 is a view taken along II-II' of FIG. 4, according to an embodiment of the present disclosure. FIG. 7 is a view taken along III-III' of FIG. 4, according to an embodiment of the present disclosure.

Referring to FIGS. 1 to 7, the data link wirings DLL of the display apparatus according to the embodiment of the present disclosure may include first links LL1 and second links LL2. The second links LL2 may be disposed between the first links LL1. The second links LL2 may include a material different from the first links LL1. The second links LL2 may be disposed a layer different from the first links LL1. The data link wirings DLL may be formed by using a process of forming the pixel driving circuit DC of each pixel area PA. For example, the first links LL1 may be formed simultaneously with the first capacitor electrode 231 of each pixel area PA, and the second links LL2 may be formed simultaneously with the second capacitor electrode 232 of each pixel area PA. The first links LL1 may include a same material as the first capacitor electrode 231 of each pixel area PA, and the second links LL2 may include a same material as the second capacitor electrode 232 of each pixel area PA. Thus, in the display apparatus according to the embodiment of the present disclosure, an area occupied by the data link wirings DLL may be minimized, without decreasing the process efficiency.

In the display apparatus according to the embodiment of the present disclosure, at least one of the insulating layers 110, 120, 130, 140, 150, 160, 170 and 180 on the display area AA may extend onto the bezel area BZ. For example, in the display apparatus according to the embodiment of the present disclosure, the buffer insulating layer 110, the gate insulating layer 120, the lower interlayer insulating layer 130, the upper interlayer insulating layer 140, the device passivation layer 150, the lower planarization layer 160 and the upper planarization layer 170 may extend onto the bezel area BZ of the device substrate 100. The first links LL1 may be disposed on a same layer as the first capacitor electrode 231 of each pixel area PA. For example, the first links LL1 may be disposed between the gate insulating layer 120 and the lower interlayer insulating layer 130. The second links LL2 may be disposed on a same layer as the second capacitor electrode 232 of each pixel area PA. For example, the second links LL2 may be disposed between the lower interlayer insulating layer 130 and the upper interlayer insulating layer 140. Thus, in the display apparatus according to the embodiment of the present disclosure, the first links LL1 and the second links LL2 of the data link wirings DLL, which are disposed side by side may be insulated from each other, without decreasing the process efficiency.

At least one encapsulating dam 105 may be disposed on the bezel area BZ. The encapsulating dam 105 may block a flow of the second encapsulating layer 420, which is an organic insulating layer. For example, the second encapsulating layer 420 may be formed in a region defined by the encapsulating dam 105. The encapsulating dam 105 may extend along an edge of the display area AA. The encapsulating dam 105 may be disposed between the display area AA and the gate driver GD. The encapsulating dam 105 may cross between the display area AA and the pad area PAD. Thus, in the display apparatus according to the embodiment of the present disclosure, a malfunction of the gate driver GD by the second encapsulating layer 420 may be prevented. And, in the display apparatus according to the embodiment of the present disclosure, the distortion of a signal applied through the pad are PAD due to the second encapsulation layer 420 may be prevented. Therefore, in the display apparatus according to the embodiment of the present disclosure, the reliability may be improved.

An organic insulating layer may be not stacked around the encapsulating dam 105. For example, a dam area DR in which the encapsulating dam 105 is disposed may be disposed between the display area AA and the pad area PAD, which are disposed side by side in a first direction X. The bezel area BZ between the display area AA and the dam area DR may include a first bezel area B1, in which the lower planarization layer 160 and the upper planarization layer 170 are disposed, and a second bezel area B2, in which the lower planarization layer 160 and the upper planarization layer 170 are not disposed. For example, the second bezel area B2 may be disposed between the first bezel area B1 and the dam area DR. The bezel area BZ between the dam area DR and the pad area PAD may include a third bezel area B3 in which the lower planarization layer 160 and the upper planarization layer 170 are not disposed, and a fourth bezel area B4 in which the lower planarization layer 160 and the upper planarization layer 170 are disposed. For example, the third bezel area B3 may be disposed between the dam area DR and the fourth bezel area B4. The display area AA, the first bezel area B1, the second bezel area B2, the dam area DR, the third bezel area B3, the fourth bezel area B4 and the pad area PAD may be disposed side by side in the first direction X. The encapsulating dam 105 may cross between the display area AA and the pad area PAD. For example, the encapsulating dam 105 may extend on the dam area DR in a second direction Y. The second direction Y may be a direction intersecting the first direction X. For example, the second direction Y may be a direction perpendicular to the first direction X. The upper planarization layer 170 may be spaced apart from the encapsulating dam 105. For example, the second bezel area B2 and the third bezel area B3 may extend parallel to the dam area DR in the second direction Y. For example, the second bezel area B2 may be covered by the second encapsulating layer 420. Thus, in the display apparatus according to the embodiment of the present disclosure, the flow of the second encapsulating layer 420, which is an organic insulating layer may be effectively blocked by the encapsulating dam 105.

The encapsulating dam 105 may be formed by using a process of forming the insulating layers 110, 120, 130, 140, 150, 160, 170 and 180, which are stacked on the device substrate 100. For example, the encapsulating dam 105 may include a first dam pattern **105*a* formed simultaneously with the upper planarization layer 170 and a second dam pattern 105*b* formed simultaneously with the bank insulating layer 180. The first dam pattern 105*a* may have a same thickness as the upper planarization layer 170. An upper surface of the second dam pattern 105*b* opposite to the device substrate 100 may have a same level as an upper surface of the bank insulating layer 180 opposite to the device substrate 100. The first dam pattern 105*a* may be covered by the second dam pattern 105*b*. For example, a step of forming the encapsulating dam 105 may include a step of removing the lower planarization layer 160 formed on the second bezel area B2, the dam area DR and the third bezel area B3, a step of forming the first dam pattern 105*a* by a process of patterning the upper planarization layer 170 formed on the second bezel area B2, the dam area DR and the third bezel area B3, and a step of forming the second dam pattern 105*b* by a process of patterning the bank insulating layer 180 formed on the second bezel area B2, the dam area DR and the third bezel area B3. The first encapsulating layer 410 and the third encapsulating layer 430 may extend outside of the encapsulating dam 105. For example, the third encapsulating layer 430 may be in direct contact with the first encapsulating layer 410 on the third bezel area B3 and the fourth bezel area B4**.

A first power voltage supply line VDL for applying the positive power voltage to the pixel driving circuit DC of each pixel area PA and a second power voltage supply line VSL for applying the negative power voltage to the second electrode 330 of each pixel area PA may be disposed on the bezel area BZ. The second power voltage supply line VSL may be electrically connected to the second electrode 330 at the outside of the display area AA. For example, the second power voltage supply line VSL may extend along an edge of the display area AA. The second power voltage supply line VSL may extend at the outside of the encapsulating dam 105. That is, in the display apparatus according to the embodiment of the present disclosure, the second electrode 330 may be electrically connected to the second power voltage supply line VSL by penetrating only the first encapsulating layer 410 and the third encapsulating layer 430. Thus, in the display apparatus according to the embodiment of the present disclosure, a process of connecting the second electrode 330 to the second power voltage supply line VSL may be simplified.

The power lines PL may be electrically connected to the first power voltage supply line VDL. For example, the first power voltage supply line VDL may extend in the first direction X, and the first power voltage supply line VDL may electrically connect between the display area AA and the pad area PAD. The first power voltage supply line VDL may cross the encapsulating dam 105. Each of the data link wirings DLL may cross the first power voltage supply line VDL. For example, the first links LL1 and the second links LL2 may extend in a third direction V different from the first direction X and the second direction Y, respectively. The third direction V may be a direction inclined to the first direction X and the second direction Y. The first power voltage supply line VDL may cross a plurality of the first link LL1 and a plurality of the second link LL2 between the display area AA and the pad area PAD. The first power voltage supply line VDL may be insulated from the data link wirings DLL. For example, the first power voltage supply line VDL may be disposed between the upper interlayer insulating layer 140 and the device passivation layer 150. The first power voltage supply line VDL may be insulated from the second links LL2 by the upper interlayer insulating layer 140. The first power voltage supply line VDL may be insulated from the first links LL1 by the lower interlayer insulating layer 130 and the upper interlayer insulating layer 140.

The first power voltage supply line VDL may include a plurality of blocking holes Tg, which are disposed between the display area AA and the dam area DR and/or between the dam area DR and the pad area PAD. Each of the blocking holes Tg may extend parallel to the encapsulating dam 105. For example, each of the blocking holes Tg may extend in the second direction Y. The blocking holes Tg may be spaced apart from the encapsulating dam 105. For example, the blocking holes Tg may include first blocking holes g1 disposed between the pad area PAD and the dam area DR, and second blocking holes g2 disposed between the dam area DR and the display area AA. The first blocking holes g1 and the second blocking holes g2 may be spaced apart from the lower planarization layer 160 and the upper planarization layer 170. For example, the first blocking holes g1 may be disposed on the third bezel area B3, and the second blocking holes g2 may be disposed on the second bezel area B2.

The first blocking holes g1 may be disposed side by side in the second direction on the third bezel area B3. For example, each of the first blocking holes g1 may cross one of the first links LL1 and one of the second links LL2. Each of the first blocking holes g1 may cross a region disposed between the data link wirings DLL. The second blocking holes g2 may be disposed side by side in the second direction on the second bezel area B2. For example, each of the second blocking holes g2 may cross one of the first links LL1 and one of the second links LL2. Each of the second blocking holes g2 may cross a region disposed between the data link wirings DLL. A region in which each of the second blocking holes g2 crosses may be different from the regions in which the first blocking holes g1 cross. For example, at least one of the data link wirings DLL overlapping with each of the first blocking holes g1 may not overlap the second blocking holes g2. Thus, in the display apparatus according to the embodiment of the present disclosure, region between the data link wirings DLL may cross one of the first blocking holes g1 or one of the second blocking holes g2.

The upper interlayer insulating layer 140, the first power voltage supply line VDL and the device passivation layer 150, which are disposed on the data link wirings DLL extending in the third direction V may have a concave-convex shape in which concave portions and convex portions are repeated. Thus, in the display apparatus according to the embodiment of the present disclosure, a void which is not filled by the device passivation layer 150 may be generated between the convex portions of the first power voltage supply line VDL. The void formed between the convex portions of the first power voltage supply line VDL may extend parallel to the data link wirings DLL. The external moisture penetrated through the lower planarization layer 160 and/or the upper planarization layer 170, which are made of an organic insulating material, may move along the void.

A first width w1 of each first blocking hole g1 and a second width w2 of each second blocking hole g2 may be greater than a distance d between the data link wirings DLL. For example, the second width w2 of each second blocking hole g2 may be a same as the first width w1 of each first blocking hole g1. Thus, in the display apparatus according to the embodiment of the present disclosure, each of the first blocking holes g1 and each of the second blocking holes g2 may be filled by an insulating layer formed by a subsequent process of the first power voltage supply line VDL. For example, the device passivation layer 150 may include a portion disposed inside each first blocking hole g1 and a portion disposed inside each second blocking hole g2. The void generated between the convex portions of the first power voltage supply line VDL by the data link wirings DLL may be blocked by the device passivation layer 150. That is, in the display apparatus according to the embodiment of the present disclosure, external moisture moving along the void may be blocked by a portion of the device passivation layer 150 disposed inside the first blocking holes g1 or a portion of the device passivation layer 150 disposed inside the second blocking holes g2. Therefore, in the display apparatus according to the embodiment of the present disclosure, the penetration of the external moisture via the void generated by the data link wirings DLL may be blocked. And, in the display apparatus according to the embodiment of the present disclosure, the deterioration of the light-emitting devices 300 due to the external moisture may be prevented.

Accordingly, the display apparatus according to the embodiment of the present disclosure may include the data link wirings DLL electrically connecting the display area AA and the pad area PAD between the device substrate 100 and the upper interlayer insulating layer 140, the first power voltage supply line VDL electrically connecting the display area AA and the pad area PAD on the upper interlayer insulating layer 140, the encapsulating dam 105 crossing between the display area AA and the pad area PAD on the device passivation layer 150 covering the first power voltage supply line VDL, and the upper planarization layer 170 being spaced apart from the encapsulating dam 105, wherein the first power voltage supply line VDL may include the first blocking holes g1 between the pad area PAD and the encapsulating dam 105 and the second blocking holes g2 between the encapsulating dam 105 and the display area AA, a region between adjacent two data link wirings DLL may cross one of the first blocking holes g1 or one of the second blocking holes g2. Thus, in the display apparatus according to the embodiment of the present disclosure, the penetration of the external moisture via the void generated between the convex portions of the first power voltage supply line VDL due to the data link wirings DLL may be blocked. Therefore, in the display apparatus according to the embodiment of the present disclosure, the deterioration of the light-emitting devices 300 due to the penetration of the external moisture may be prevented.

In the display apparatus according to the embodiment of the present disclosure, an inner dummy wiring DV may be disposed between the lower planarization layer 160 and the upper planarization layer 170 on the first bezel area B1. The inner dummy wiring DV may include a same material as the intermediate electrodes 510. For example, the inner dummy wiring DV may be formed simultaneously with the intermediate electrodes 510. The inner dummy wiring DV may be electrically connected to the first power voltage supply line VDL between the device substrate 100 and the lower planarization layer 160. Thus, in the display apparatus according to the embodiment of the present disclosure, a resistance of the first power voltage supply line VDL supplying the positive power voltage may be reduced by the inner dummy wiring DV. Therefore, in the display apparatus according to the embodiment of the present disclosure, a luminance deviation due to voltage drop may be prevented.

In the display apparatus according to the embodiment of the present disclosure, the bezel area BZ may include a bending area BA. The bending area BA may be a region of the device substrate 100, which is bent. The bending area BA may be disposed between the display area AA and the pad area PAD. For example, the pad area PAD may move to a back side of the display area AA by bending of the bending area BA. The dam area DR in which the encapsulating dam 105 is disposed may be disposed between the bending area BA and the display area AA. For example, the bending area BA may be disposed between the fourth bezel area B4 and the pad area PAD. That is, in the display apparatus according to the embodiment of the present disclosure, the blocking holes Tg of the first power voltage supply line VDL may be disposed between the bending area BA and the display area AA. For example, the first blocking holes g1 may be disposed between the bending area BA and the dam area DR. The first blocking holes g1 may be disposed side by side in the second direction Y between the upper planarization layer 170 of the fourth bezel area B4 and the encapsulating dam 105. The second blocking holes g2 may be disposed side by side in the second direction Y between the encapsulating dam 105 and the upper planarization layer 170 of the first bezel area B1. Thus, in the display apparatus according to the embodiment of the present disclosure, the damage of the first power voltage supply line VDL due to a bending stress generated by bending the bending area BA may be prevented, and the penetration of the external moisture via the void generated by the data link wirings DLL may be blocked.

The display apparatus according to the embodiment of the present disclosure is described that the pixel driving circuit DC of each pixel area PA comprises of the first thin film transistor T1, the second thin film transistor T2 and the storage capacitor Cst. However, in the display device according to another embodiment of the present disclosure, the pixel driving circuit DC of each pixel area PA may include at least one thin film transistor. For example, in the display device according to another embodiment of the present disclosure, the pixel driving circuit DC of each pixel area PA may include the first thin film transistor T1, the second thin film transistor T2, the storage capacitor Cst and a third thin film transistor. The third thin film transistor may transmit a reference voltage to the storage capacitor Cst according to the gate signal. For example, the third thin film transistor may be a switching thin film transistor. The third thin film transistor may be electrically connected between a reference voltage supply line suppling the reference voltage and the storage capacitor Cst. The third thin film transistor may have a same structure as the first thin film transistor T1. The third thin film transistor may be formed simultaneously with the first thin film transistor T1. Thus, in the display apparatus according to another embodiment of the present disclosure, the degree of freedom in configuring the pixel driving circuit DC in each pixel area PA may be improved.

In the display apparatus according to the embodiment of the present disclosure, the location and the electric connection of the drain electrodes 225 and the source electrode 227 in each pixel area PA may vary depending on the configuration of the pixel driving circuit DC and/or the type of the corresponding thin film transistors T1 and T2 in the corresponding pixel area PA. For example, in the display apparatus according to another embodiment of the present disclosure, the second gate electrode 223 of the second thin film transistor T2 in each pixel area PA may be electrically connected to the first drain electrode of the first thin film transistor T1 in the corresponding pixel area PA. Thus, in the display apparatus according to another embodiment of the present disclosure, the degree of freedom in the configuration of the pixel driving circuit DC in each pixel area PA and the type of the thin film transistors T1 and T2 included in each pixel driving circuit DC may be improved.

Figure 8:
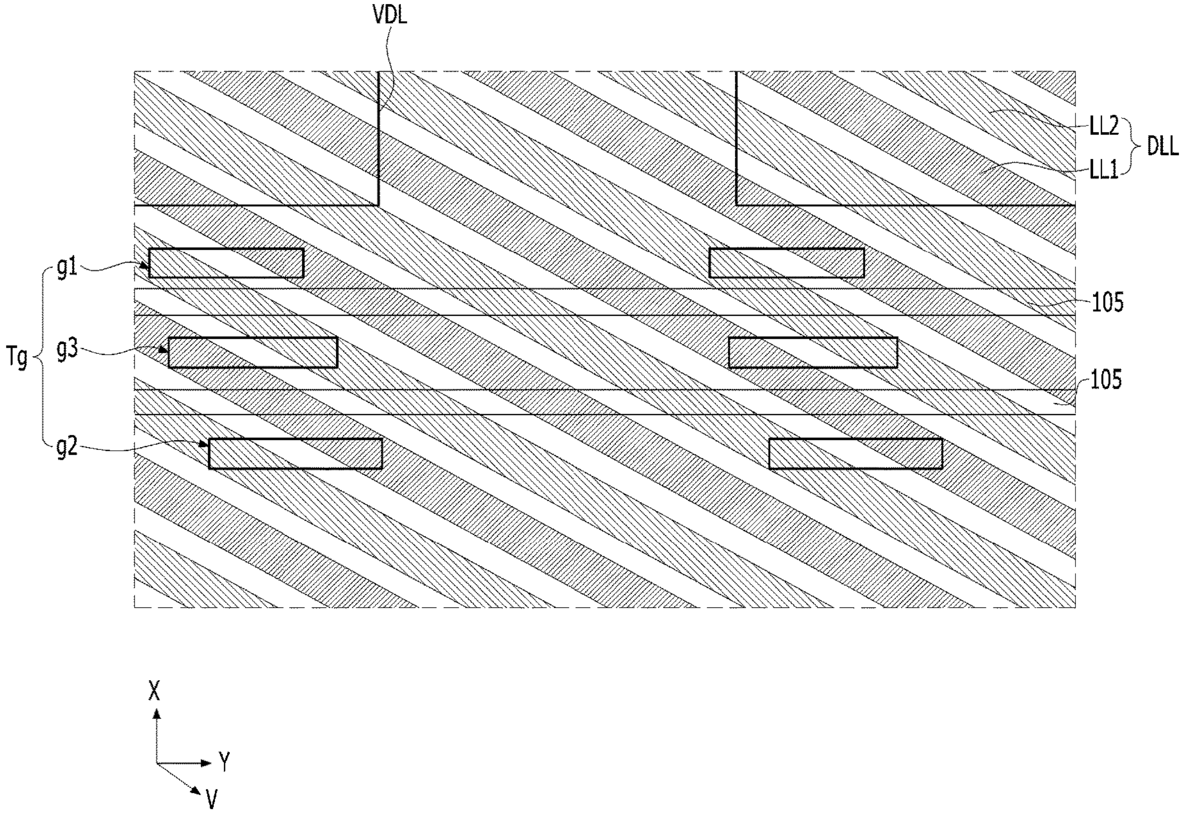
FIGS. 8 to 10 are views showing the display apparatus according to another embodiment of the present disclosure.

The display apparatus according to the embodiment of the present disclosure is described that each of the first blocking holes g1 and each of the second blocking holes g2 may cross regions disposed between adjacent three data link wirings DLL. However, in the display apparatus according to another embodiment of the present disclosure, each of the blocking holes Tg may cross at least one of regions between the data link wirings DLL. For example, in the display apparatus according to another embodiment of the present disclosure, each of the first blocking holes g1 and each of the second blocking holes g2 may cross regions disposed between adjacent two data link wirings DLL, as shown in FIG. 8. Therefore, in the display apparatus according to another embodiment of the present disclosure, the degree of freedom in the size of the blocking holes Tg may be improved.

The display apparatus according to the embodiment of the present disclosure is described that the data signal may be applied through the pad area PAD. However, in the display apparatus according to another embodiment of the present disclosure, the gate signal may be applied to each of the pixel area PA through the pad area PAD. For example, in the display apparatus according to another embodiment of the present disclosure, each blocking hole Tg of the first power voltage supply line VDL may cross at least one of regions between the gate link wirings. Thus, in the display apparatus according to another embodiment of the present disclosure, the degree of freedom in the configuration of the display panel DP may be improved.

In the display apparatus according to another embodiment of the present disclosure, the blocking holes Tg may include third blocking holes g3 disposed between a plurality of the encapsulating dams 105, as shown in FIG. 8. The third blocking holes g3 may extend parallel to the encapsulating dams 105. For example, the third blocking holes g3 may extend in the second direction Y. Each of the third blocking holes g3 may have a same size as each of the first blocking holes g1 and each of the second blocking holes g2. For example, each of the third blocking holes g3 may have a width greater than a distance between the data link wirings DLL. Thus, in the display apparatus according to another embodiment of the present disclosure, the external moisture moving along the void generated by the data link wirings DLL may be blocked by a portion of the device passivation layer 150 disposed inside the first blocking holes g1, a portion of the device passivation layer 150 disposed inside the second blocking holes g2 or a portion of the device passivation layer 150 disposed inside the third blocking holes g3. Therefore, in the display apparatus according to another embodiment of the present disclosure, the external moisture penetrated via the void may be effectively blocked.

Figure 9:
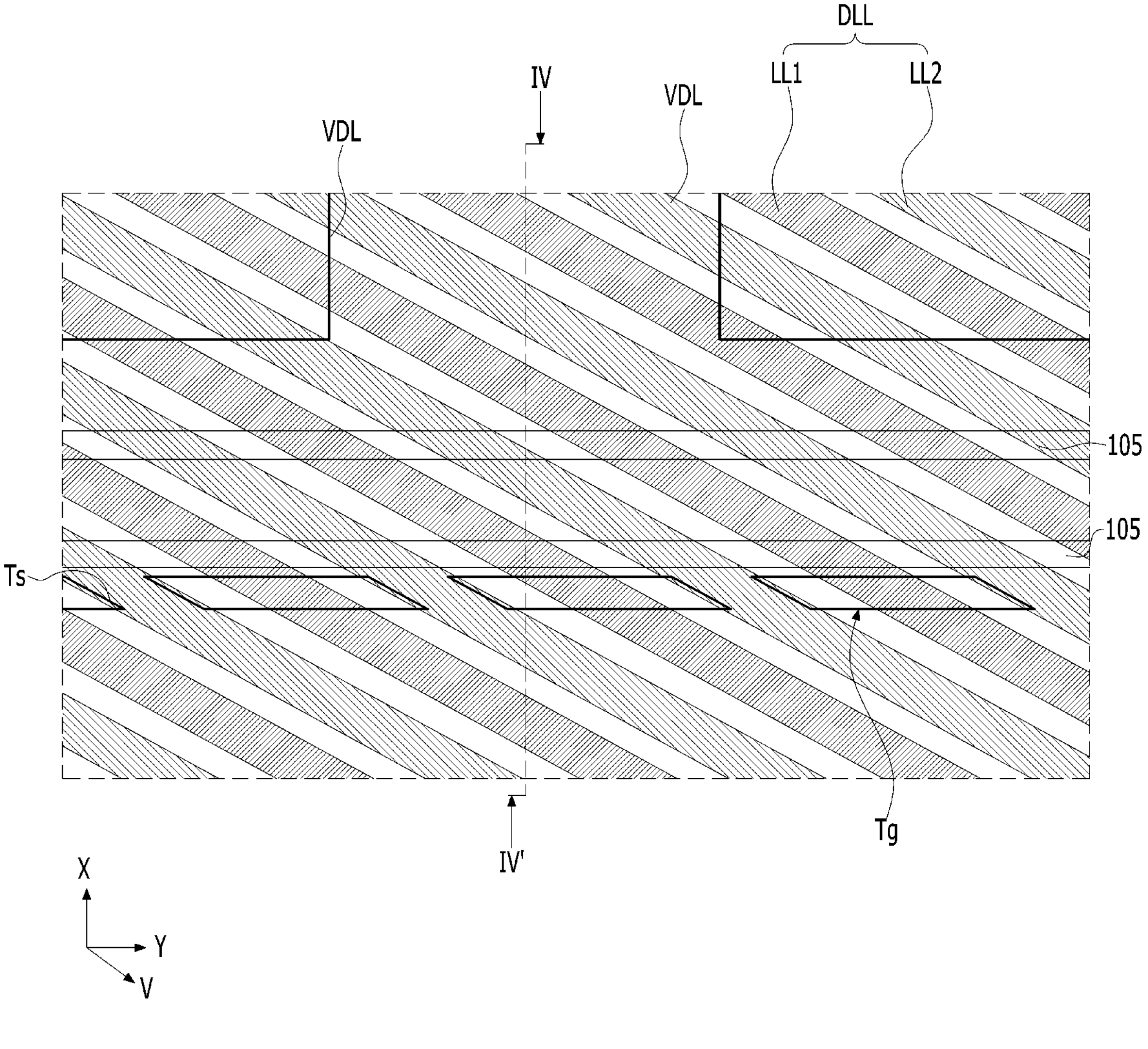
Figure 10:
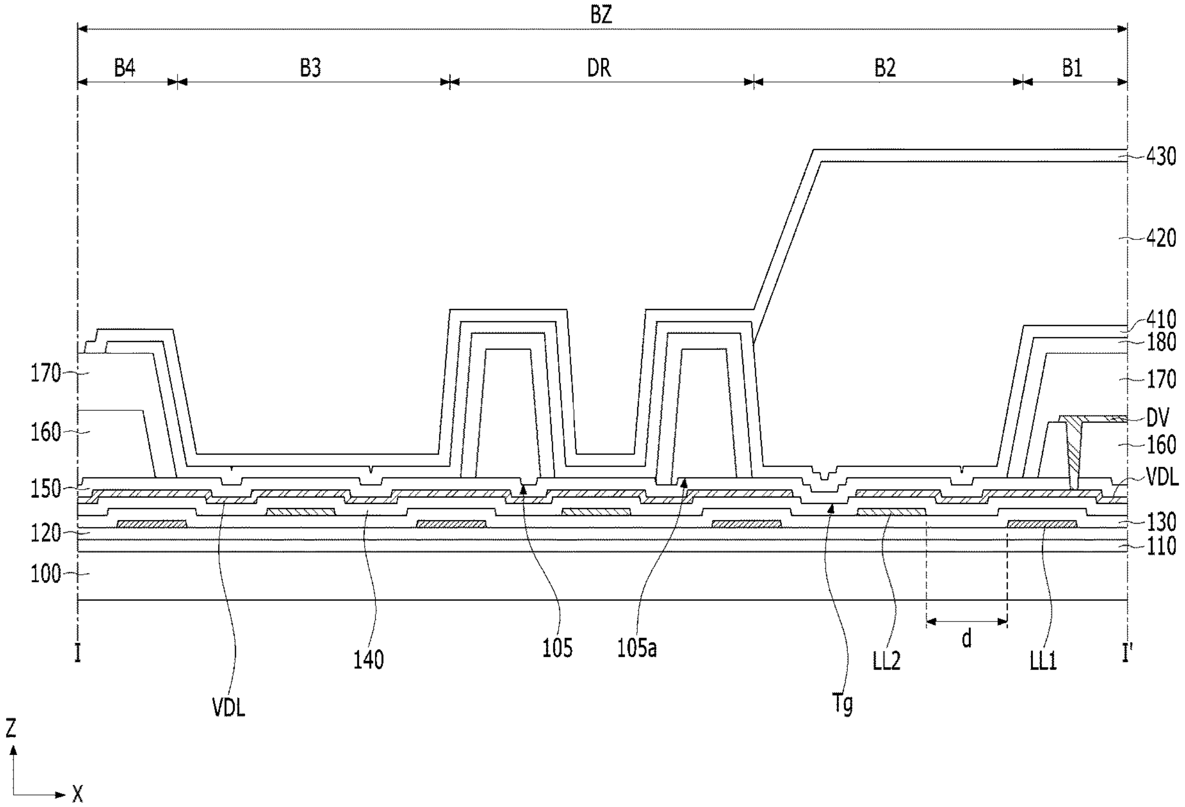

The display apparatus according to the embodiment of the present disclosure is described that the blocking holes Tg may include the first blocking holes g1 disposed between the pad area PAD and the dam area DR and the second blocking holes g2 disposed between the dam area DR and the display area AA. However, in the display apparatus according to another embodiment of the present disclosure, the blocking holes Tg may be disposed only in the second bezel area B2 or the third bezel area B3. For example, in the display apparatus according to another embodiment of the present disclosure, the blocking holes Tg of the first power voltage supply line VDL may be disposed only between the encapsulating dam 105 and the upper planarization layer 170 of the first bezel area B1, as shown in FIGS. 9 and 10. Each of the blocking holes Tg may include a side-wall Ts disposed on one of the data link wirings DLL. The side-wall Ts of each of the blocking holes Tg overlapping with the data link wirings DLL may extend in a direction same as the data link wirings DLL. For example, the side-wall Ts of each of the blocking holes Tg may extend in a third direction V inclined to the first direction X and the second direction Y. Thus, in the display apparatus according to another embodiment of the present disclosure, the disconnection of the first power voltage supply line VDL due to the blocking holes Tg may be prevented. Therefore, in the display apparatus according to another embodiment of the present disclosure, the degree of freedom in the location of the blocking holes Tg may be improved.

In the result, the display apparatus according to the embodiments of the present disclosure may comprise the link wirings electrically connecting the display area and the pad area between the device substrate and the upper interlayer insulating layer, the power voltage supply line electrically connecting the display area and the pad area on the upper interlayer insulating layer, the encapsulating dam crossing between the display area and the pad area on the device passivation layer covering the power voltage supply line, and the planarization layer being spaced apart from the encapsulating dam, wherein the power voltage supply line may include the blocking hole extending a direction parallel to the encapsulating dam between the encapsulating dam and the planarization layer, the blocking hole may cross at least one of regions disposed between link wirings. Thus, in the display apparatus according to the embodiments of the present disclosure, the external moisture penetrated via the void generated by the link wirings may be blocked. Thereby, in the display apparatus according to the embodiments of the present disclosure, the deterioration of the light-emitting device due to the penetration of the external moisture may be prevented. And, in the display apparatus according to the embodiments of the present disclosure, the life-time of the light-emitting device may be increased. That is, in the display apparatus according to the embodiments of the present disclosure, power consumption may be reduced by low-power driving.

What is claimed is:

1. A display apparatus comprising:

data link wirings on a device substrate, the data link wirings electrically connecting a display area and a pad area of a bezel area, which are side by side in a first direction;

an upper interlayer insulating layer on the data link wirings, the upper interlayer insulating layer overlapping with the display area and the bezel area;

a power voltage supply line on the upper interlayer insulating layer, the power voltage supply line electrically connecting the display area and the pad area;

a device passivation layer on the upper interlayer insulating layer, the device passivation layer covering the power voltage supply line;

a first encapsulating dam on the device passivation layer, the first encapsulating dam extending between the display area and the pad area in a second direction that intersects the first direction; and a planarization layer on the device passivation layer, the planarization layer spaced apart from the first encapsulating dam, wherein the power voltage supply line includes a plurality of blocking holes that extend between the first encapsulating dam and the planarization layer in the second direction, and wherein each of the plurality of blocking holes cross at least one region between the data link wirings.

2. The display apparatus according to claim 1, wherein the device substrate includes a dam area in which the first encapsulating dam is disposed, a first bezel area between the display area and the dam area, and a second bezel area between the first bezel area and the dam area, wherein the planarization layer is on the first bezel area, and wherein the plurality of blocking holes comprise a plurality of second blocking holes, the plurality of second blocking holes side by side in the second direction on the second bezel area.

3. The display apparatus according to claim 1, wherein the device substrate includes a dam area in which the first encapsulating dam is disposed, a third bezel area between the dam area and the pad area, and a fourth bezel area between the third bezel area and the pad area, wherein the planarization layer is on the fourth bezel area, and wherein the plurality of blocking holes comprise a plurality of first blocking holes, the plurality of first blocking holes side by side in the second direction on the third bezel area.

4. The display apparatus according to claim 1, wherein a width of each of the plurality of blocking holes is greater than a distance between the data link wirings.

5. The display apparatus according to claim 4, wherein the device passivation layer includes a portion inside each of the plurality of blocking holes.

6. The display apparatus according to claim 2, further comprising:

a second encapsulating dam on the device passivation layer, the second encapsulating dam extending between the first encapsulating dam and the pad area in the second direction, wherein the plurality of blocking holes include a plurality of third blocking holes that extend between the first encapsulating dam and the second encapsulating dam in the second direction, and wherein each of the plurality of third blocking holes crosses at least one region between the data link wirings.

7. The display apparatus according to claim 6, wherein a region in which each of the plurality of third blocking holes crosses is different from regions in which a plurality of first blocking holes or the plurality of second blocking holes cross.

8. The display apparatus according to claim 6, wherein a width of each of the plurality of third blocking holes is greater than a distance between the data link wirings.

9. The display apparatus according to claim 8, wherein each of a plurality of first blocking holes, the plurality of second blocking holes, and the plurality of third blocking holes has a same size.

10. The display apparatus according to claim 8, wherein the device passivation layer includes a portion inside each of the plurality of third blocking holes.

11. The display apparatus according to claim 1, wherein the data link wirings extend in a direction inclined toward the first direction and the second direction.

12. The display apparatus according to claim 2, further comprising:

an inner dummy wiring in the first bezel area and between the planarization layer and the device passivation layer, wherein the inner dummy wiring is electrically connected to the power voltage supply line.

13. The display apparatus according to claim 1, wherein a sidewall of one or more of the plurality of blocking holes extends in a direction inclined toward the first direction and the second direction.

14. A display apparatus comprising:

a device substrate including a display area, a first bezel area, a second bezel area, a dam area, a third bezel area, a fourth bezel area, a bending area and a pad area, which are side by side in a first direction;

an upper interlayer insulating layer on the display area, the upper interlayer insulating layer extending onto the pad area;

data link wirings between the device substrate and the upper interlayer insulating layer, the data link wirings electrically connecting the display area and the pad area by crossing the bending area;

a power voltage supply line on the upper interlayer insulating layer, the power voltage supply line electrically connecting the display area and the pad area by crossing the bending area;

a device passivation layer on the upper interlayer insulating layer, the device passivation layer covering the power voltage supply line;

an encapsulating dam on the dam area, the encapsulating dam crossing between the bending area and the display area in a second direction intersecting the first direction; and a planarization layer on the display area, the first bezel area and the fourth bezel area of the device substrate, the planarization layer spaced apart from the second bezel area, the dam area and the third bezel area, wherein the power voltage supply line includes a first blocking hole on the third bezel area and a second blocking hole on the second bezel area, and wherein each of the first blocking hole and the second blocking hole extends parallel to the encapsulating dam, and the first blocking hole and the second blocking hole cross at least one region between the data link wirings.

15. The display apparatus according to claim 14, wherein a region in which the second blocking hole crosses is disposed side by side a region in which the first blocking hole crosses in an extending direction of the data link wirings.

16. The display apparatus according to claim 14, wherein each of the first blocking hole and the second blocking hole has a width larger than a distance between the data link wirings.

17. The display apparatus according to claim 16, wherein the second blocking hole has a same size as the first blocking hole.

18. The display apparatus according to claim 16, wherein the device passivation layer includes a first portion inside the first blocking hole and a second portion inside of the second blocking hole.

19. The display apparatus according to claim 14, further comprising:

a third blocking hole between a plurality of encapsulating dams, and wherein the third blocking hole crosses at least one of regions between the data link wirings.

* * * * *